US006976426B2

(12) United States Patent
McLean et al.

(10) Patent No.: US 6,976,426 B2
(45) Date of Patent: Dec. 20, 2005

(54) IMAGE REPLICATION ELEMENT AND METHOD AND SYSTEM FOR PRODUCING THE SAME

(75) Inventors: Michael E. McLean, Etowah, NC (US); Brett Scherrman, Huntersville, NC (US); Douglas C. Neckers, Perrysburg, OH (US); Peter Serguievski, Perrysburg, OH (US)

(73) Assignee: Day International, Inc., Dayton, OH (US)

( * ) Notice: Subject to any disclaimer, the term of this patent is extended or adjusted under 35 U.S.C. 154(b) by 114 days.

(21) Appl. No.: 10/119,059

(22) Filed: Apr. 9, 2002

(65) Prior Publication Data

US 2003/0188650 A1 Oct. 9, 2003

(51) Int. Cl.[7] ................................................ G03F 7/20
(52) U.S. Cl. .................... 101/401.1; 101/395; 355/43; 355/67
(58) Field of Search ............................ 101/395, 401.1; 347/238, 239, 255; 355/43, 67; 430/306

(56) References Cited

U.S. PATENT DOCUMENTS

| | | | | |
|---|---|---|---|---|
| 4,116,715 | A * | 9/1978 | Smiggen et al. | 134/6 |
| 4,323,637 | A * | 4/1982 | Chen et al. | 430/271.1 |
| 5,049,901 | A * | 9/1991 | Gelbart | 347/239 |
| 5,132,723 | A * | 7/1992 | Gelbart | 355/40 |
| 5,254,437 | A * | 10/1993 | Ueda et al. | 430/273.1 |
| 5,278,027 | A | 1/1994 | Clarke | |
| 5,745,156 | A * | 4/1998 | Federico et al. | 347/256 |
| 5,763,134 | A * | 6/1998 | Busman et al. | 430/157 |
| 5,877,848 | A | 3/1999 | Gillette et al. | |
| 5,994,026 | A | 11/1999 | DeBoer et al. | |
| 6,121,996 | A * | 9/2000 | Gelbart | 347/241 |
| 6,200,646 | B1 * | 3/2001 | Neckers et al. | 427/510 |
| 6,225,026 | B1 * | 5/2001 | Lifshitz et al. | 430/308 |
| 6,266,080 | B1 * | 7/2001 | Gelbart | 347/254 |
| 6,285,488 | B1 | 9/2001 | Sandstrom | |
| 6,326,127 | B1 * | 12/2001 | Morren et al. | 430/286.1 |
| 6,567,205 | B1 * | 5/2003 | Eggers et al. | 359/292 |
| 6,641,970 | B2 * | 11/2003 | Van Damme et al. | 430/164 |
| 2001/0044076 | A1 * | 11/2001 | Hiller et al. | 430/306 |
| 2002/0012110 | A1 | 1/2002 | Luellau et al. | |

FOREIGN PATENT DOCUMENTS

| | | | |
|---|---|---|---|
| DE | 42 32 187 | A | 3/1994 |
| EP | 0953 877 | A | 11/1999 |
| WO | WO 98/53370 | * | 11/1998 |
| WO | WO 98/53370 | A | 11/1998 |
| WO | WO 01/069320 | A | 9/2001 |

* cited by examiner

*Primary Examiner*—Stephen R. Funk
(74) *Attorney, Agent, or Firm*—Dinsmore & Shohl, LLP

(57) ABSTRACT

A process and system for making an image replication element from a photosensitive printing element by digital photopolymerization are provided. The process includes forming a desired printing image on a photopolymer layer by digital light processing without the use of either a mask layer or a laser.

24 Claims, 2 Drawing Sheets

IMAGE REPLICATION ELEMENT AND METHOD AND SYSTEM FOR PRODUCING THE SAME

The present invention relates to printing, and more particularly to a method and associated apparatus for producing by digital light processing an image replication element usable for graphic arts reproduction such as, for example, a flexographic printing plate.

Flexography, also known as aniline printing, is a form of raised printing that utilizes a flexible plate and quick drying inks. The flexible plate is usually made from soft rubber or polymers and carries a relief image that is slightly raised, inked and then transferred directly to a substrate material. This printing method is a high speed process used for extra large print runs and is well suited for a wide variety of substrate materials including acetate film, polyethylene, brown paper and newsprint.

Flexographic printing plates can be prepared using photopolymerizable compositions, such as for example those described in U.S. Pat. No. 4,323,637 (Chen et al) to form relief images. The photopolymerizable compositions generally comprise an elastomeric binder, at least one monomer and a photoinitiator. The photopolymerizable composition is generally provided as a layer interposed between a support and a cover sheet or multilayer cover elements. Upon imagewise exposure to actinic radiation, polymerization, and hence, insolubilization of the photopolymerizable layer occurs in areas exposed to the actinic radiation. Treatment with a suitable solvent (such as a developer) removes the unexposed areas of the photopolymerizable layer, leaving a relief image that can be used for flexographic printing.

Conventional methods of imagewise exposure require the use of a mask having transparent and opaque areas which cover the photopolymerizable layer. The transparent areas of the mask allow the exposure of the photopolymerizable layer to actinic radiation wherein the opaque areas of the mask prevent exposure and polymerization of the underlaying areas of the photosensitive element. The mask is usually a photographic negative of the desired printing image. If corrections are needed in the final image, a new negative must be made. This is a time-consuming process. In addition, the mask may experience slight dimensional changes due to changes in temperature and humidity. Thus, the same mask, when used at different times or in different environments, may provide different results and could cause registration problems.

Accordingly, there is a desire in the industry to directly record information on a photosensitive layer using digital information without a mask. With digital information, digitized images may be transmitted from a distant location, and corrections can be made easily and quickly by adjusting the digitized image. In addition, the digitized image could be either positive or negative, eliminating the need to have both positive-working and negative-working photosensitive materials, or positive and negative masks, thereby saving storage space and, thus, reducing costs. Another advantage is registration is controlled precisely by a machine during the imaging step. Also, digitized imaging without a mask is particularly well suited for making seamless, continuous printing forms.

One approach has been to use laser ablation, such as that disclosed in U.S. Pat. No. 5,262,275 to Fan, which describes a photosensitive element having a laser ablatable masking layer that is coated over a photopolymerizable layer. The masking layer, although opaque to actinic radiation, is capable of absorbing infrared radiation. During use, the masking layer is imagewise-ablated in areas where development is desired in the photopolymerizable layer. The photosensitive element is then overall exposed with actinic radiation to cure the exposed areas of the photopolymerizable layer, followed by processing in a suitable solvent (or developer) to remove the unexposed areas of the element. Thus, a flexible relief image in the photosensitive element is produced.

However, laser ablation has a disadvantage in that it produces solid debris that can be a hazard and requires wiping and collection to insure that the debris does not materially affect the desired image. Additionally, laser ablation suffers from the disadvantage that it is a binary process, meaning that it produces only either opaque or essentially transparent areas upon imaging, and does not provide areas of intermediate density. In other words, a mask image formed using laser ablation tends not to have continuous tone images.

Another approach has been to directly image a photopolymerizable layer with a laser, such as disclosed by U.S. Pat. No. 5,278,027 to Clarke, wherein a surface of a printing element is initially coated with a layer of photopolymer liquid. Thereafter, selected areas of the layer of liquid are hardened by exposure to a beam produced by a computer-controlled laser to provide the printing element with an image replication element having a desired pattern.

However, it is generally recognized in the industry that using a laser to directly image photopolymerizable layers used to prepare flexographic printing plates has not been very practical. Photopolymerizable compositions used in such layers typically have a low photosensitivity and require long exposure times even with high-powered lasers. In addition, most photopolymerizable compositions have their greatest sensitivity in the ultraviolet region of the electromagnetic spectrum. While UV lasers are known, economical and reliable UV lasers with high power are generally not available.

Thus, there is a need in the industry for a novel method and associated apparatus for producing an image replication element having excellent continuous tone images and which can be prepared by digital imaging photopolymerization without the use of either a laser or a masking layer.

SUMMARY OF THE INVENTION

The present invention addresses these needs by providing a method and associated apparatus for producing by digital light processing an image replication element that is used for graphic arts reproduction and, in a preferred embodiment, is used to prepare a flexographic printing plate.

The image replication element is formed by providing a liquid photopolymer on at least a portion of a support assembly surface, and irradiating the photopolymer layer with a reflected image for a time sufficient to cure the photopolymer and form a raised image on the support assembly. The liquid photopolymer is preferably selected from the group consisting of acrylates, epoxies, urethanes, and unsaturated polyesters. The reflected image is produced from a light source that is digitally processed by a digital micromirror device or spatial light modulator to produce the raised image as will be explained in greater detail below.

The resulting image replication element may then be mounted onto a printing device and used to print in a conventional manner. Once the particular printing job for which the image was produced has been completed, the image replication element may be demounted and, if desired, the raised image may be removed so that the support assembly can receive a new raised image. The raised image is preferably removed by an abrading mechanism, which mechanically grinds, scrapes, or cuts away the image until the surface layer of the support assembly is exposed.

An important advantage of this invention is that the photopolymer layer can be imaged in a multilevel manner, that is, it is imaged in gradations so that continuous image tone can be achieved. Therefore, multilevel information generated or written therein, can be communicated in a suitable continuous-tone fashion to the relief imaging layer. Thus, the pixels at the edge of a printing dot can be written to partial density, providing varying densities to shape the relief image of the final flexographic printing element following development.

Another advantage is that, because the image replication element may be provided in the form of a replaceable flat plate, the printer need not tie up a printing cylinder for each plate as the plates may be readily demounted and stored. Further, as the image on the printing plate is replaceable, the printer need not maintain a large inventory of plates, which reduces costs. Lastly, as the image is formed digitally, there is no degradation in quality of the image as with masks or film layers so that the image which is printed is sharp and well defined.

Accordingly, it is a feature of the present invention to provide an image replication element having a digitally formed raised imaged surface which may be utilized in flexographic as well as other graphic arts reproduction processes.

According to another feature of the present invention provided is an image replication element for use in graphic arts reproduction comprising a support base and a raised imaged surface of a plurality of rectangular-shaped pixels on the support base, wherein the raised imaged surface has been formed imagewise directly onto the support assembly by digital imaging photopolymerization.

According to still another feature of the present invention provided is a method of making a flexographic printing plate comprising the steps of providing a support base having a surface and providing a layer of liquid photopolymer on at least a portion of the surface of the support base. The method further includes irradiating the liquid polymer with a light source reflected by a spatial light modulator in a desired image pattern for a time sufficient to photopolymerize the liquid polymer into a raised image directly on the support base.

According to yet another feature of the present invention provided is a digital imaging photopolymerization system for providing an image replication element usable in the production of a flexographic printing plate. The system comprises a support assembly adapted to receive a liquid photopolymer, a light source for irradiating the photopolymer to form a raised image on the support assembly, and a digital light processor for modulating and directing the light source onto the photopolymer in a full image pattern that forms the raised image. The system further includes a computer for controlling the operation of the system.

According to still yet another feature of the present invention provided is a method of making a reimagable flexographic printing plate comprising the steps of providing a support assembly and providing a raised image on the surface of the support assembly by digital imaging photopolymerization utilizing a digital light processor to form a printing plate. The method further includes mounting the printing plate on a printing device and printing a substrate using the raised image; demounting the printing plate from the printing device and removing the raised image from the printing plate such that the flexographic printing plate is adapted to receive a new raised imaged surface.

According to another feature of the present invention provided is a system for generating an image on a photocurable resin layer for use in graphic arts reproduction. The system comprises a light source, a condenser for receiving light from the light source and providing collimated light, a spatial light modulator for receiving the collimated light and for selectively modulating the collimated light into a desired image pattern, and projection optics for projecting the desired image pattern onto the photocurable resin layer for polymerization into the image.

These, and other features and advantages of the present invention, will become apparent from the following detailed description, the accompanying drawings, and the appended claims.

DETAILED DESCRIPTION OF THE PREFERRED EMBODIMENT

Figure 1:
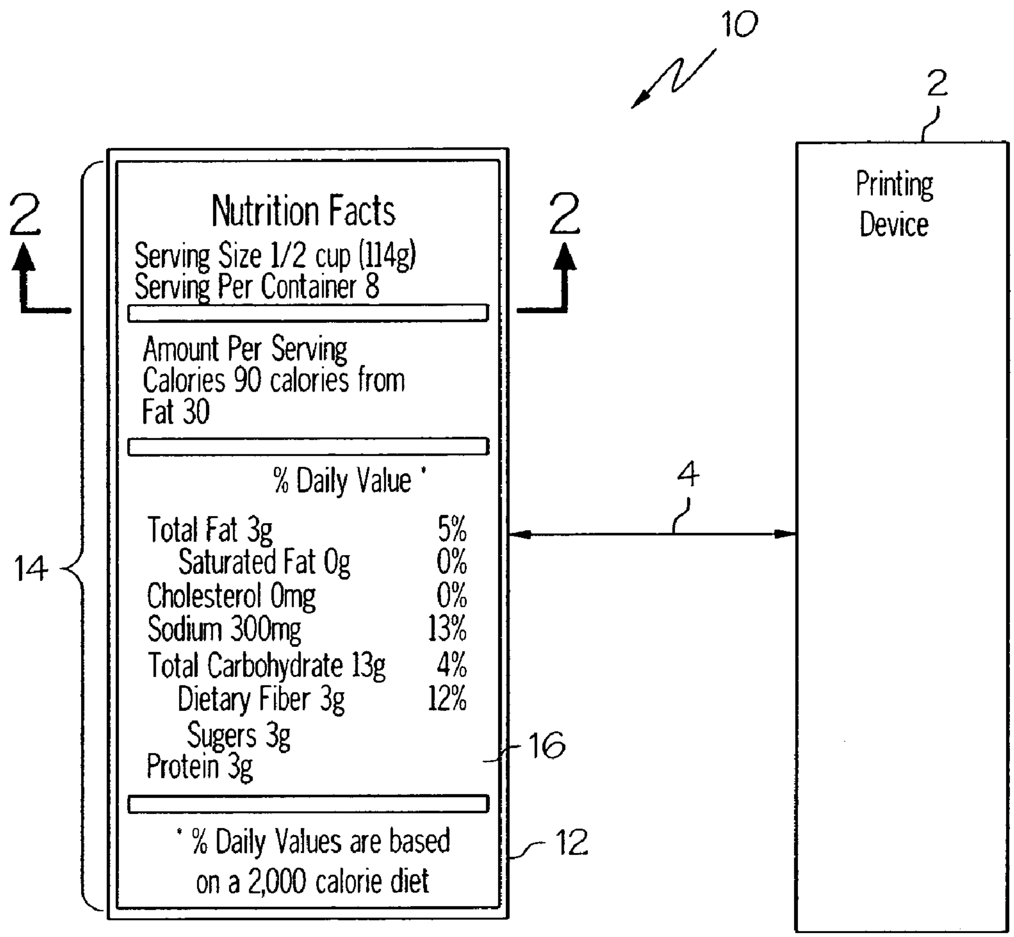
FIG. 1 is a front elevation view of an image replication element that has been formed with a raised imaged surface on a support assembly according to one embodiment of the present invention, which may be used with a printing device as a printing plate.
Figure 2:
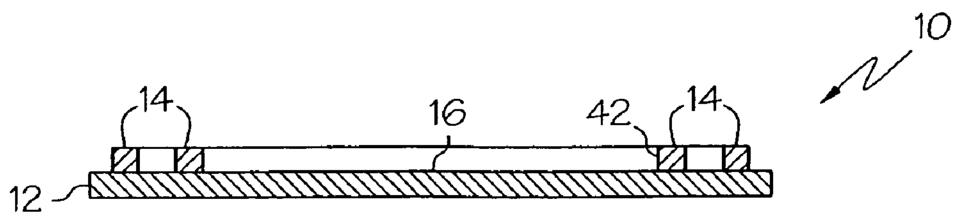
FIG. 2 is a sectional side view of the image replication element of FIG. 1 taken along section line 2—2 in FIG. 1.

FIGS. 1 and 2, illustrate a preferred embodiment of the present invention in which an image replication element 10 comprises a support assembly or base 12 supporting a raised relief image 14 on its surface 16. As illustrated schematically in FIG. 1, the image replication element is preferably mounted as a printing plate on a printing device 2 to print the relief image on a provided substrate, such as for example a web or sheet of paper, plastic, foil or the like. After use, the image replication element 10 may be readily demounted from the printing device 2. As the mounting and demounting processes of the image replication element, which is indicated by the numeral 4, are conventional in the art, no further discussion is provided.

Although, the image replication element 10 of the present invention may be utilized as a flexographic printing plate, it is to be appreciated that with suitable modifications, the image replication element may also be useful in other direct and indirect printing processes including offset lithography, as well as in intaglio processes, such as direct and indirect gravure printing processes. Moreover, the image replication element may be used in any process or system in which a liquid coating agent is applied and then transferred to a substrate.

The base 12 can be any flexible material that is conventionally used in photosensitive elements. Examples of such materials include, but are not limited to, polymeric films, foams, and fabrics. Flexible metal or paper sheets, or laminates of any of these, can also be used as the base 12. A preferred material is a polymer formed from a liquid resin that is provided as an initial undeveloped layer to the image replication element 10. The liquid resin is a photocurable or photopolymerizable material that is sensitive to radiation commonly in the visible and ultraviolet regions of the electromagnetic spectrum (that is from about 250 to about 770 nm) and is developed as described herein. The terms "photocurable" and "photopolymerizable" are generally recognized as essentially the same in the art of flexographic printing plates.

Additionally, liquid photoresins or photopolymers are known in the art and commercially available from a number of companies, such as CIBATOOL® SL 5149 acrylate resin, available from Ciba Specialty Chemicals, PHOTOMER® 4770 amine acrylae, available from Henkle, or SGL-1 photopolymers, available from Spectra Group Limited, Inc. Accordingly, any photopolymer formulation including at least one photopolymerizable monomer that can be polymerized upon exposure to the actinic radiation noted above may be used in the practice of this invention.

The formulation may also include one or more polymerization initiators that have a sensitivity to the actinic radiation noted above, such as IRGACURE® 369 aminoalkylphenone photoinitiator, IRGACURE® 819 photoinitiator, DAROCURE® 1173 (Ciba Specialty Chemicals) photoinitiator, H-Nu 470 (Spectra Group Limited, Inc.) photoinitiator, or isopropylthioxanthone (ITX) (Chemfirst Fine Chemicals) photoinitiator. In most cases, the initiator will be sensitive to any visible or ultraviolet radiation.

The thickness of the developed polymer base 12 can be varied, as long as it is sufficient to sustain the wear of a printing press, but thin enough to be flexible for wrapping around a print cylinder. A preferred polymer base material is a photoresin cured to a thickness of about 0.25 mm to about 0.4 mm. The polymer base 12 may be coated with one or more "subbing" layers to improve adhesion of the relief image 14. The back side of the polymer base 12 may be coated with antistatic agents and/or slipping layers or matte layers to improve handling and "feel" of the element.

The raised image 14 may take the form of any indicia including numbers, letters, graphics, and the like needed to perform the print job. The thickness of the relief imaging layer can vary over a wide range depending upon the type of printing element desired. For so called "thin plates" the layer can be from about 0.05 to about 0.15 cm in thickness. Thicker elements will have a relief imaging layer up to 0.7 cm in thickness.

Figure 3:
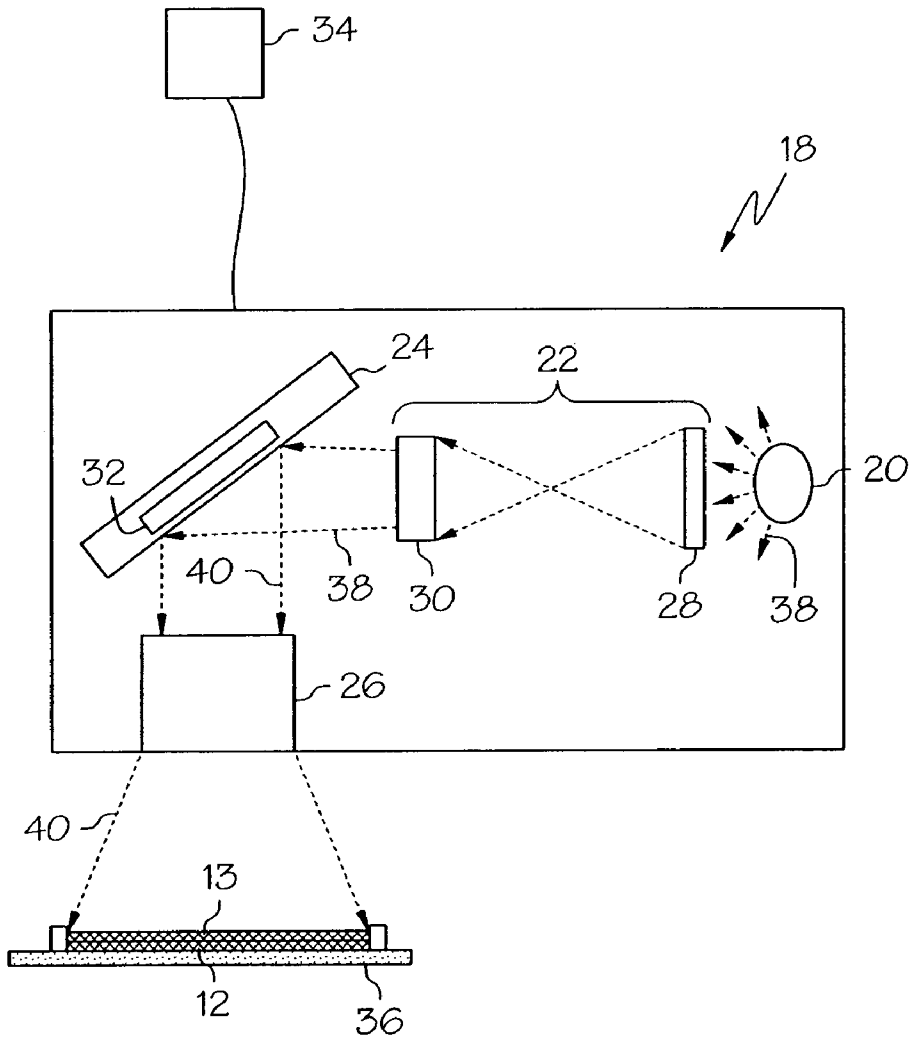
FIG. 3 is a schematic diagram of an image processing device used according to one embodiment of practicing the method of the present invention to produce an image replication element which may be used in the preparation of a flexographic printing plate.

With reference also made to FIG. 3, an apparatus or digital light imaging system 18 for forming the image replication element 10 according to the present invention is shown. In particular, the relief image 14 (FIG. 1) of the image replication element 10 is formed from an undeveloped liquid photoresin layer 13 using the imaging system 18. The liquid photoresin layer 13 is a photocurable or photopolymerizable material that is sensitive to radiation commonly in the visible and ultraviolet regions of the electromagnetic spectrum (that is from about 250 to about 770 nm). Accordingly, the photoresin layer 13 and the initial liquid resin provided to form the base 12 may be the same.

A preferred formulation for the photoresin layer 13 contains CIBATOOL® SL 5149 acrylate resin, and 1.5% w of IRGACURE® 819 photoinitiator. It has been found that with the imaging system 18, the preferred formulation produces relief images having very fine details with no doming or rounding.

As shown in FIG. 3, the imaging system 18 includes a light source 20, a condenser 22, a digital light processor 24, and projection optics 26. The light source 20 provides the above mentioned actinic radiation to cure or polymerize the liquid photoresin layer 13 onto the polymer base 12. Preferably, the light source 20 is a visible light source, such as a metal halide lamp. The metal halide lamp should be unfiltered and have enough wattage, such as 270 W, to suitably cross-link the photoresin 13 with both visible and ultraviolet light. Lamps of higher light intensity may also be used to increase the rate of polymerization.

The condenser 22 focuses the divergent spectral radiation of the light source 20 into parallel rays such that a sufficient concentration of actinic radiation is available to form the relief image 14 with the imaging system 18. As such, the condenser 22 receives light from the light source and provides collimated light to the digital light processor 24. Preferably, the condenser 22 comprises a convex lens 28 at one end and an adjustable slit 30 at the other, the slit being in the focal plane of the lens. Alternatively, the condenser 22 may be a single mirror. The condenser 22 may also comprise a plurality of lenses or a plurality of lenses in combination with at least one mirror or a plurality of mirrors or in combination with at least one lens.

The digital light processor 24 selectively modulates the received collimated light into a desired image pattern and directs the desired image pattern to the projection optics 26. The projection optics 26 focus and position the image output onto the photoresin layer 13 to form the relief image 14. The projection optics are preferably formed by a so-called Dyson imaging system comprising a filed lens, aperture lens, and a spherical imaging mirror. The input and output numerical aperture is 0.167. The magnification is 1 to 1. In a preferred embodiment, the object and the image size is 10.2×13.6 mm.

The digital light processor 24 converts digital content into a digital bit stream that can be read by an included mirror-type spatial light modulator 32. Preferably, the digital content is composed on a microprocessor 34 that is in communication with the digital light processor 24 for image generation by the imaging system 18. However, other sources of the digital content, such as memory chips, analog-to-digital decoders, video processors, digital signal processors, may also be processed by the digital light processor 24.

Generally, the mirror-type spatial light modulator 32 is an individually addressable matrix of modulating micromirrors that builds digital images based on the provided digital bit stream. Mirror-type spatial light modulators include devices which tilt each micromirror by electrostatic force, devices which tilt each micromirror by mechanical deformation of a fine piezoelectric element, and the like. One suitable spatial light modulator 32 is the Digital Micromirror Device (DMD) developed by Texas Instruments. The DMD semiconductor is basically an optical switch or a reflective spatial light modulator that consists of a matrix of about one million digitally-controlled microscopic mirrors.

Each digitally-controlled microscopic mirror is mounted on a hinge structure to allow each mirror to tilt at an angle from a horizontal plane between two states, +theta degrees for "on" or −theta degrees for "off." For the DMD semiconductor, the mirror tilt angle is ±10 degrees from the plane of the silicon substrate. As data "1" of the bit stream is written to a memory cell of the light modulator 32, the associated micromirror tilts by +theta degrees which directs a pixel of light from the light source 20 onto the resin layer 13, via the projection optics 26. As data "0" of the bit stream is written to a memory cell of the light modulator, the associated micromirror tilts by −theta degrees, which directs the light away from the projection optics 26.

Each microscopic mirror can be electrically switched "on" and "off" up to approximately 50,000 times per second in accordance with the provided digital bit stream. As such, the wavelength or grey scale of incident light from the light source 20 is controlled by the duration of time that a micromirror is in the "on" state. By controlling the wavelength or grey scale of the light source 20, for each pixel, the desired image 40 is formed from the actinic radiation 38 of the light source 20. By this method, the relief image 14 may be formed relatively quickly as practically all of the incident light from the light source 20 is reflected toward the resin layer 13.

Additionally, because the light modulator 32 has a plurality of micromirrors arranged in a matrix, a full frame image of information on resin layer 13 is photo-curable at one time. Furthermore, because each micromirror has a size of about 16 μm by 16 μm and the micromirrors are spaced less than 17 μm from each other, this close spacing of the micromirrors results in images that are projected as seamless, with higher resolution and little apparent pixellation. Moreover, with each micromirror being rectangular shaped, each reflected incident of light creates a rectangular pixel with extremely sharp edges in the resin layer 13. This is unlike the circular or rounded pixels created by laser imaging.

Accordingly, the relief image 14 is formed by the light processor 24 reflecting actinic radiation in a precise pattern and with the proper amount of intensity from the light source 20, through the projection unit 26, and onto the support base 12, thereby permitting cross-linking of the supported photoresin 13 in one step. Furthermore, it is to be appreciated that such an arrangement permits longer exposure times with grey scale modulation than scanning systems which must cross-link the photoresin linearly across a moving surface of the photoresin. Moreover, each light modulating element of the light processor 24 has the advantage of a consistent spot size, shape, and location which permits the formation of sharp images with well-defined boundaries. The currently available DMD semiconductor from Texas Instruments permits imaging resolutions up to 1024 pixels×768 pixels. However, the full-frame imaging approach of the present invention can also easily be applied to any projection device that may result in higher resolutions and improved print quality.

In order that the invention may be more readily understood, reference is made to the following method steps, which are intended to be illustrative of a preferred use of the imaging system 18 of the invention, but are not intended to be limiting in scope.

In using the imaging system 18 to produce the image replication element 10, preferably, the polymer base 12 is formed separately from the imaging system 18 using a large area, pulsed UV curing unit, such as a Xenon Corporation RC-500B. In this manner, the base 12 is then provided to the imaging system 18 on a support assembly 36 as a stock material.

Alternatively, the polymer base 12 may be formed by the imaging system 18 directly or by an optional back flash step. The back flash step is a blanket exposure of a quantity of a liquid resin to actinic radiation through the support assembly 36 to form the base 12. Any of the conventional radiation sources discussed above may be used for the back flash step. Exposure times generally range from a few seconds up to about a minute.

Preferably, the polymer base 12 is formed using a formulation of 98.5% CIBATOOL® SL 5149 acrylate resin and 1.5% IRGACURE® 819 photoinitiator, which is cured to a thickness of about 0.25 mm to about 0.4 mm. It should, however, be appreciated by those persons skilled in the art that any other formulation which provides a suitable support base upon which the relief image layer 14 bonds may be used. Additionally, it should be appreciated that the polymer base 12 is of an appropriate shape and size for use as a printing plate. Generally, the polymer base 12 will be rectangular in shape, as illustrated in FIG. 1.

Next, a quantity of the liquid photoresin 13 is provided to cover either a portion or the entire base 12. The liquid photoresin 13 is preferably the same formulation used to form the polymer base 12. However, the liquid photoresin 13 may contain other additives depending on the final properties desired for the relief imaging layer 14. Such additives include sensitizers, rheology modifiers, thermal polymerization inhibitors, tackifiers, plasticizers, colorants, antioxidants, or fillers.

As shown in FIG. 3, the support assembly 36, carrying both the photoresin layer 13 and the base 12 thereon, is positioned relative to the imaging system 18 to accommodate the production of an image replication element 10 of a desired size. The support plate 36 may be movable to automate the positioning of a new plate having a base and a quantity of photoresin thereon under the imaging system 18. However, the support assembly 36 is preferably stationary at least during the exposure of the liquid photoresin layer 13 with actinic radiation.

With the support assembly 36 in proper alignment with the imaging system 18, actinic radiation 38 from light source 18 is then directed through condenser 22 towards the light modulation elements 32 of the light processing device 24. The actinic radiation is then processed into a desired image 40 based on an inputted digital bit stream and reflected by the micromirror device 24 through projection unit 26 and onto selected portions of the liquid photoresin for activation and hardening. It is to be appreciated that the desired image 40 projected by the light processing device 24 at one instance is a full-frame image, such as illustrated in FIG. 1.

As generally known in the art, the actinic radiation exposure time can vary from a few seconds to several minutes, depending upon the intensity and spectral energy distribution of the radiation, its distance from the imaging element, and the nature and thickness of the photopolymerizable relief imaging layer.

Once the liquid photoresin layer 13 has been properly hardened by the projected image 40, any excess, undeveloped photoresin is washed away in a developer leaving the relief image 14 crossed-linked upon the surface 16 of the polymer base 12 (FIG. 2). As generally known in the art, the choice of the developer will depend primarily on the chemical nature of the photopolymerizable material to be removed. Typically, development is usually carried out at about room temperature, in which the developers can be organic solvents, aqueous or semi-aqueous solutions, and water. Suitable organic solvent developers include aromatic or aliphatic hydrocarbon and aliphatic or aromatic halohydrocarbon solvents, or mixtures of such solvents with suitable alcohols.

Suitable semi-aqueous developers usually contain water and a water miscible organic solvent and an alkaline material. Suitable aqueous developers usually contain water and an alkaline material. Development time can vary, but it is preferably in the range of about 1 to 30 minutes. The developer can be applied in any convenient manner, including immersion, spraying and brush or roller application. Brushing aids can be used to remove the undeveloped portions of the composition. However, washout is frequently carried out in an automatic processing unit which uses a developer and mechanical brushing action to remove the unexposed portions of the plate, leaving a relief constituting the exposed image 14 and the polymer base 12.

Following solvent development, the relief printing plates are generally blotted or wiped dry, and then dried in a forced air or infrared oven. Drying times and temperatures may vary, however, typically the plate is dried for 60 to 120 minutes at 60 degrees C. High temperatures are not recommended because the support can shrink and this can cause registration problems.

Detackification is an optional post-development treatment which can be applied if the surface is still tacky, such tackiness not generally being removed in post-exposure. Tackiness can be eliminated by methods well known in the art, such as treatment with bromine or chlorine solutions. Such treatments have been disclosed in, for example, U.S. Pat. No. 4,400,459 to Greetzmacher, and U.S. Pat. No. 4,400,460 to Fickes et al. Detackification can also be accomplished by exposure to radiation sources having a wavelength not longer than 300 nm, as disclosed in U.S. Pat. No. 4,806,506 to Gibson.

Most flexographic printing plates are uniformly post-exposed to ensure that the photopolymerization process is complete and that the plate will remain stable during printing and storage. This post-exposure step may utilize the same radiation source as the polymer base 12 exposure.

If desired, for increased durability, any suitable ceramic coating, such as a refractory oxide or metallic carbide coating, may be applied to the surface of the relief image 14. For example, tungsten carbide-cobalt, tungsten carbide-nickel, tungsten carbide-cobalt chromium, tungsten carbide-nickel chromium, chromium-nickel, aluminum oxide, chromium carbide-nickel chromium, chromium carbide-cobalt chromium, tungsten-titanium carbide-nickel, cobalt alloys, oxide dispersion in cobalt alloys, aluminum-titania, copper-based alloys, chromium based alloys, chromium oxide, chromium oxide plus aluminum oxide, titanium oxide, titanium plus aluminum oxide, iron based alloys, oxide dispersed in iron based alloys, nickel and nickel based alloys, and the like may be used. Preferably chromium oxide, aluminum oxide, silicon oxide or mixtures thereof could be used as the coating material, with chromium oxide being the most preferred.

By the above described method an image replication element 10 may be produced having a relief image of rectangular pixels having sharp edge boundaries 42 (FIG. 2) of a height of about 0.4 mm to about 1 mm above the surface 16 of the polymer base 12. For image replication elements requiring relief images higher than 1.0 mm, several layers of the photoresin 13 can be polymerized sequentially upon each other. The resulting image replication element 10 may be attached to a printing cylinder in a conventional manner and mounted in a flexographic printing press.

Figure 4:
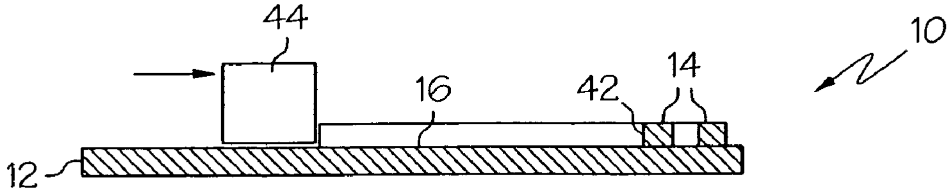
FIG. 4 is a schematic diagram of the image replication element of FIG. 1 taken along section line 2—2 as the image is being removed by an abrading mechanism.

Because the process of the present invention forms the relief image 14 directly onto the surface of the polymer base 12 with no intervening mask, there is no distortion of the image, which remains sharp and well defined. In addition, the relief image(s) on the surface 16 of the polymer base 12 may be removed and new images built up on the surface. For example, as schematically illustrated in FIG. 4, showing the relief image 14 partially removed, the relief image 14 may be removed by a suitable polymer abrading mechanism 44 which mechanically grinds, scrapes, or cuts away the image until the surface 16 of the base 12 remains. The reprocessed polymer base 12 may then be provided upon which a new image may be built up as previously described.

Because the images for each printing job may be stored in computer memory, the printer need not stock in inventory multiple image replication elements. Rather, each printing job may be created and the same polymer support base imaged over and over again, reducing both storage and materials cost. Further, because each print job is digitally imaged directly on the base 12, the print quality is high. Moreover, this technique enables image replication elements of variable widths to be rapidly produced.

While certain representative embodiments and details have been shown for purposes of illustrating the invention, it will be apparent to those persons skilled in the art that various changes in the methods and apparatus disclosed herein may be made without departing from the scope of the invention.

What is claimed is:

1. A method of making a reimagable image replication element for use in graphic arts reproduction comprising the steps of: providing a support assembly comprising a cured photoresin support base and a surface provided with a subbing layer; providing a photopolymerized raised full-frame image having a thickness ranging from about 0.05 cm to about 0.70 cm on the surface of said support assembly by digital imaging photopolymerization of a liquid polymer into the raised full-frame image, said liquid polymer being photopolymerized into the raised full-frame image simultaneously, utilizing a digital light processor to form a printing plate; mounting said printing plate on a printing device and printing a substrate using said raised image; demounting said printing plate from said printing device and removing said raised image from said printing plate such that said printing plate is adapted to receive a new raised imaged surface.

2. A method as claimed in claim 1 in which said polymer is selected from the group consisting of acrylates, epoxies, urethanes, and unsaturated polyesters.

3. A method as claimed in claim 1 in which said support base comprises a polymer base layer.

4. A method as claimed in claim 1 further including the step of directing said desired full-frame image pattern into a projection lens to cast said desired image pattern onto said surface of said support assembly.

5. The method as claimed in claim 1 in which said raised image is removed by an abrading mechanism.

6. A method as claimed in claim 1 in which said support base is selected from the group consisting of polymeric films, foams, paper, metal, laminates, and fabrics.

7. A method of making an image replication element for use in graphic arts reproduction comprising the steps of:

providing a cured photoresin support base having a top surface, a bottom surface and a thickness ranging from about 0.25 mm to about 0.4 mm, said top surface having a subbing layer, and said bottom surface having a layer selected from the group consisting of an anti-static layer, a slipping layer, a matte layer, and combinations thereof;

providing a layer of liquid photopolymer, comprising an elastomeric binder, a monomer, and a photoinitiator, on at least a portion of said top surface of said support base; and irradiating said liquid photopolymer with a light source reflected by a spatial light modulator in a desired full-frame image pattern for a time sufficient to photopolymerize said liquid photopolymer into a raised full-frame image in the desired full-frame image pattern directly on said support base, said liquid polymer being photopolymerized into the raised full-frame image simultaneously, said subbing layer improving adhesion of said photopolymerized raised full-frame image to said support base, and said method producing said raised full-frame image with a thickness ranging from about 0.05 cm to about 0.70 cm.

8. A method as claimed in claim 7 in which said light source comprises a visible light source.

9. A method as claimed in claim 8 in which said visible light source comprises a metal halide lamp.

10. A method as claimed in claim 7 in which said desired full-frame image pattern is formed by a plurality of rectangular pixels of actinic radiation which photopolymerizes selected portions of said liquid photopolymer into said raised image having sharp, well-defined rectangular edges.

11. A method as claimed in claim 7 further comprises washing away undeveloped photopolymer with a developer.

12. A method as claimed in claim 11 wherein said developer is selected from the group consisting of organic solvents, water, aqueous solutions containing an alkaline material, semi-aqueous solutions containing a water miscible organic solvent and an alkaline material, and combinations thereof.

13. A method as claimed in claim 11 further comprising mechanically removing undeveloped photopolymer.

14. A method as claimed in claim 11 further comprising drying the image replication element.

15. A method as claimed in claim 7 in which said liquid photopolymer is sensitive to radiation from about 250 nm to about 770 nm.

16. A method as claimed in claim 7 in which said liquid photopolymer is selected from the group consisting of acrylates, epoxies, urethanes, unsaturated polyesters, monomers sensitive to actinic radiation, and combination thereof.

17. A method as claimed in claim 7 in which said support base comprises a polymer base layer.

18. A method as claimed in claim 7 further comprising directing said desired image pattern into a projection lens to cast said desired image pattern onto said layer of the liquid photopolymer.

19. A method as claimed in claim 7 further comprising:

mounting said image replication element on a printing device;

printing a substrate using said polymerized and raised full frame image;

demounting said image replication element from said printing device; and removing said polymerized and raised full frame image from said image replication element such that said support base is adapted to receive a new polymerized and raised full frame image.

20. The method as claimed in claim 19 in which said polymerized and raised full frame image is removed by an abrading mechanism.

21. A method as claimed in claim 7 further comprising:

providing collimated radiation to said spatial light modulator from a condenser receiving radiation from a source; and projecting said desired full-frame image pattern onto said layer through projection optics.

22. A method as claimed in claim 21 wherein said spatial light modulator comprises a plurality of individually addressable micromirrors each having an active position that temporarily reflects, when instructed by instructions, a beam of said collimated radiation, which represents a rectangular pixel of said desire image pattern, towards said projection optics.

23. A method as claimed in claim 22, further comprising providing said instructions using a digital bit stream representing said desired image pattern.

24. A method as claimed in claim 23, further comprising providing said digital bit stream using a computer in communication with said spatial light modulator.

* * * * *